(12) United States Patent
Soga

(10) Patent No.: US 10,637,451 B2
(45) Date of Patent: Apr. 28, 2020

(54) PULSE POSITION MODULATION CIRCUIT AND TRANSMISSION CIRCUIT

(71) Applicant: FUJITSU LIMITED, Kawasaki-shi, Kanagawa (JP)

(72) Inventor: Ikuo Soga, Isehara (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 16/521,657

(22) Filed: Jul. 25, 2019

(65) Prior Publication Data
US 2020/0067496 A1   Feb. 27, 2020

(30) Foreign Application Priority Data
Aug. 21, 2018   (JP) .................. 2018-154617

(51) Int. Cl.
| H03K 7/04 | (2006.01) |
| H03K 7/06 | (2006.01) |
| H03K 9/04 | (2006.01) |
| H03K 9/06 | (2006.01) |
| H03K 5/00 | (2006.01) |
| H04B 1/717 | (2011.01) |
| H03L 7/08 | (2006.01) |
| H03K 5/133 | (2014.01) |

(52) U.S. Cl.
CPC ......... *H03K 5/00006* (2013.01); *H03K 5/133* (2013.01); *H03L 7/0805* (2013.01); *H04B 1/7174* (2013.01)

(58) Field of Classification Search
CPC ...... H03K 5/00006; H03K 5/133; H03K 7/04; H04B 1/7174; H04B 1/71637; H04B 1/7163; H03L 7/0805; H04N 1/4056

USPC ................... 375/239; 332/112–114
See application file for complete search history.

(56) References Cited

U.S. PATENT DOCUMENTS

| 6,362,898 | B1* | 3/2002 | McDonald | ........... H04N 1/4056 |
| | | | | 358/1.7 |
| 7,002,425 | B2* | 2/2006 | Maunuksela | ........... H03K 5/133 |
| | | | | 327/164 |
| 8,451,939 | B2* | 5/2013 | Nakasha | ................ H03K 7/04 |
| | | | | 332/106 |
| 2005/0141605 | A1* | 6/2005 | Akahori | ............ H04B 1/71637 |
| | | | | 375/239 |

(Continued)

FOREIGN PATENT DOCUMENTS

JP    2007-228546    9/2007

*Primary Examiner* — Phuong Phu
(74) *Attorney, Agent, or Firm* — Fujitsu Patent Center

(57) ABSTRACT

A pulse position modulation circuit includes a delay locked loop circuit configured to include a plurality of delay circuits coupled in a cascade, each of the plurality of delay circuits being configured to delay an input signal by a time width corresponding to a control signal so as to generate an output signal, a plurality of pulse generation circuits, each of which is configured to generate a pulse with a pulse width corresponding to a phase difference between a first signal and a second signal which have different phases from each other at different timings corresponding to states of the first signal and the second signal, each of the first signal and the second signal being the input signal or the output signal of the plurality of delay circuits, and a selection circuit configured to select pulses generated by the plurality of pulse generation circuits.

12 Claims, 9 Drawing Sheets

(56) References Cited

U.S. PATENT DOCUMENTS

2007/0058769 A1 3/2007 Ikeda
2009/0129460 A1* 5/2009 Nakasha .............. H04B 1/7163
　　　　　　　　　　　　　　　　　　　　　375/238

* cited by examiner

PULSE POSITION MODULATION CIRCUIT AND TRANSMISSION CIRCUIT

CROSS-REFERENCE TO RELATED APPLICATION

This application is based upon and claims the benefit of priority of the prior Japanese Patent Application No. 2018-154617, filed on Aug. 21, 2018, the entire contents of which are incorporated herein by reference.

FIELD

The embodiments discussed herein are related to a pulse-position modulation circuit and a transmission circuit.

BACKGROUND

As a technique relating to a pulse generation circuit, for example, a pulse generation circuit is known which includes a delay circuit connected in a cascade, a plurality of first logic circuits connected to an output of the delay circuit generating pulses each having a time width corresponding to a delay amount per stage of the delay circuit, and a second logic circuit that obtains a logical sum of the outputs of the plurality of first logic circuits.

Related techniques are disclosed in, for example, Japanese Laid-open Patent Publication No. 2007-228546.

SUMMARY

According to an aspect of the invention, a pulse position modulation circuit includes a delay locked loop circuit configured to include a plurality of delay circuits coupled in a cascade, each of the plurality of delay circuits being configured to delay an input signal by a time width corresponding to a control signal so as to generate an output signal, a plurality of pulse generation circuits, each of which is configured to generate a pulse with a pulse width corresponding to a phase difference between a first signal and a second signal which have different phases from each other at different timings corresponding to states of the first signal and the second signal, each of the first signal and the second signal being the input signal or the output signal of the plurality of delay circuits, and a selection circuit configured to select pulses generated by the plurality of pulse generation circuits.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A pulse-position modulation (PPM) circuit is a modulation circuit that generates a pulse at a time position corresponding to an input signal. The pulse-position modulation circuit is configured to include, for example, a delay locked loop (DLL) circuit, an inverter, a plurality of impulse generation circuits, and a selection circuit. The delay locked loop circuit includes a plurality of delay elements connected to each other in a cascade, and a plurality of signals having different phases are generated by the plurality of delay elements. Each of the plurality of signals generated by the plurality of delay elements is input to a first input terminal of a corresponding impulse generation circuit as a first signal, and input to a second input terminal of the corresponding impulse generation circuit as a second signal via an inverter. The inverter phase-inverts and delays the input signal. The plurality of respective impulse generation circuits generate impulses each having a pulse width corresponding to a phase difference between the first signal input to the first input terminal and the second signal input to the second input terminal, at different timings corresponding to the states of the first and second signals. The selection circuit selects one of the impulses output from the plurality of respective impulse generation circuits according to an input signal which is supplied from the outside, and outputs the selected impulse as a modulated signal.

According to the pulse-position modulation circuit having the configuration described above, since the delay amounts in the plurality of respective delay elements are accurately controlled, a time position of the impulse to be output as a modulated signal may be accurately controlled. However, according to the pulse-position modulation circuit having the configuration described above, the pulse width of the impulse output from each impulse generation circuit changes according to a performance variation, a temperature change and others of the inverter provided outside the delay locked loop circuit. For example, when a wireless transmission is performed using the impulse output from the pulse-position modulation circuit as the modulated signal, the fluctuation of the pulse width of the impulse makes it difficult to control the frequency spectrum of a wirelessly transmitted signal.

Hereinafter, descriptions will be made on an example of an embodiment of a technique capable of suppressing the fluctuation of the pulse width in the modulated signal output from the pulse-position modulation circuit, with reference to the accompanying drawings. In the respective drawings, the

First Embodiment

Figure 1:
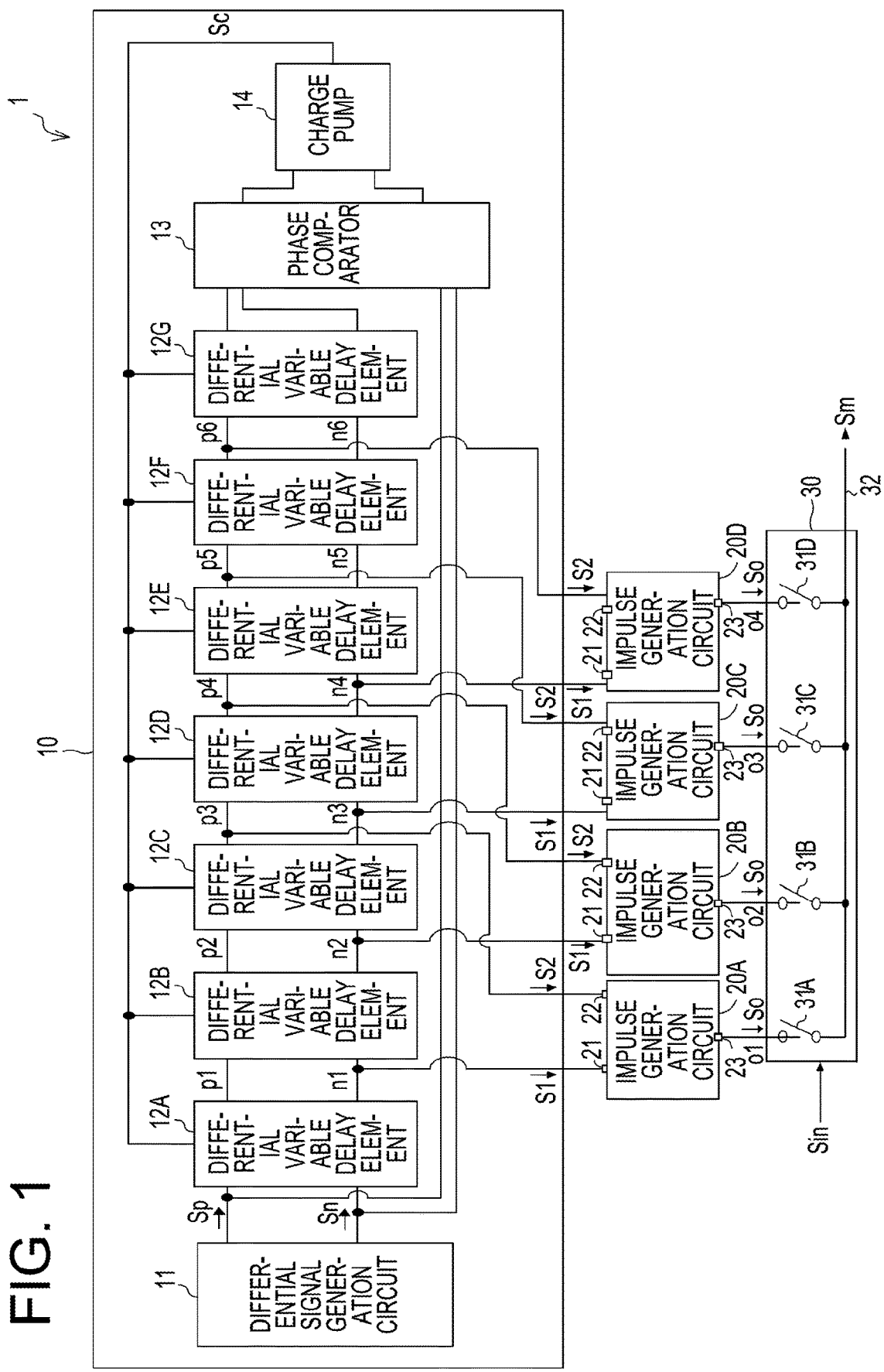
FIG. 1 is a circuit block diagram illustrating an example of a configuration of a pulse position modulation circuit according to an embodiment of the present disclosure.

FIG. 1 is a circuit block diagram illustrating an example of a configuration of a pulse-position modulation circuit 1 according to a first embodiment of the present disclosure. The pulse-position modulation circuit 1 is configured to include a delay locked loop circuit 10, a plurality of impulse generation circuits 20A to 20D, and a selection circuit 30. The delay locked loop circuit 10 is configured to include a differential signal generation circuit 11, a plurality of differential variable delay elements 12A to 12G connected in a cascade, a phase comparator 13, and a charge pump 14.

The differential signal generation circuit 11 generates differential signals of a predetermined period, which include a positive phase signal Sp and a negative phase signal Sn having phases inverted from each other (that is, the phases are different by 180°). The differential signals generated by the differential signal generation circuit 11 are input to the first-stage differential variable delay element 12A and the phase comparator 13. In addition, the differential signals may be signals generated by a circuit formed outside the delay locked loop circuit 10. In this case, the differential signal generation circuit 11 may be omitted in the delayed locked loop circuit 10.

Each of the differential variable delay elements 12A to 12G delays the input differential signals by a time width corresponding to a control signal Sc, and supplies the delayed differential signals to the rear-stage differential variable delay element. Since the plurality of differential variable delay elements 12A to 12G are connected in a cascade, the delay amounts of the differential signals are accumulated. Further, it is possible to extract the differential signals having different phases from respective nodes of signal lines to which the differential variable delay elements 12A to 12G are connected in a cascade. The delayed differential signals which are output from the final-stage differential variable delay element 12G are input to the phase comparator 13.

The phase comparator 13 generates an output corresponding to a phase difference between the delayed differential signals that are output from the final-stage differential variable delay elements 12G and the differential signals that are hardly delayed by being directly supplied from the differential signal generation circuit 11 without passing through the differential variable delay elements 12A to 12G. The output of the phase comparator 13 is supplied to the charge pump 14. The charge pump 14 includes a loop filter and generates the control signal Sc of a level corresponding to the output of the phase comparator 13. The control signal Sc is supplied to each of the differential variable delay elements 12A to 12G. The control signal Sc controls the magnitude of delay imparted to the differential signals by the differential variable delay elements 12A to 12G.

In a state where a delay locked loop is locked, the delay amount of the differential signal output from the final-stage differential variable delay element 12G is equivalent to one period of the differential signal. The delay amount in each of the differential variable delay elements 12A to 12G is equally allocated to the number of differential variable delay elements (seven differential variable delay elements in the embodiment). That is, when the period of the differential signals is T, the delay amount in each of the differential variable delay elements 12A to 12G is T/7.

Each of the impulse generation circuits 20A to 20D includes a first input terminal 21, a second input terminal 22, and an output terminal 23. Each of the impulse generation circuits 20A to 20D generates an impulse with a pulse width corresponding to a phase difference between a first signal S1 input to the first input terminal 21 and a second signal S2 input to the second input terminal 22 at a timing corresponding to the states of the first and second signals S1 and S2.

In the impulse generation circuits 20A to 20D, negative-phase signals Sn that appear in different nodes of the signal lines to which the differential variable delay elements 12A to 12G are connected in a cascade are input to the first input terminals 21, respectively, as the first signals S1. Specifically, a node n1 which is an inverse phase-side output node of the differential variable delay element 12A (an inverse phase-side input node of the differential variable delay element 12B) is connected to the first input terminal 21 of the impulse generation circuit 20A, and the negative-phase signal Sn that appears in the node n1 is input to the first input terminal 21 of the impulse generation circuit 20A as the first signal S1. Further, a node n2 which is an inverse phase-side output node of the differential variable delay element 12B (an inverse phase-side input node of the differential variable delay element 12C) is connected to the first input terminal 21 of the impulse generation circuit 20B, and the negative-phase signal Sn that appears in the node n2 is input to the first input terminal 21 of the impulse generation circuit 20B as the first signal S1. Further, a node n3 which is an inverse phase-side output node of the differential variable delay elements 12C (an inverse phase-side input node of the differential variable delay elements 12D) is connected to the first input terminal 21 of the impulse generation circuit 20C, and the negative-phase signal Sn that appears in the node n3 is input to the first input terminal 21 of the impulse generation circuit 20C as the first signal S1. Further, a node n4 which is an inverse phase-side output node of the differential variable delay element 12D (an inverse phase-side input node of the differential variable delay element 12E) is connected to the first input terminal 21 of the impulse generation circuit 20D, and the negative-phase signal Sn that appears in the node n4 is input to the first input terminal 21 of the impulse generation circuit 20D as the first signal S1.

Similarly, in the impulse generation circuits 20A to 20D, positive-phase signals Sp that appear in different nodes of the signal lines to which the differential variable delay elements 12A to 12G are connected in a cascade are input to the second input terminals 22, respectively, as the second signals S2. Specifically, a node p3 which is a positive phase-side output node of the differential variable delay elements 12C (a positive phase-side input node of the differential variable delay element 12D) is connected to the second input terminal 22 of the impulse generation circuit 20A, and the positive-phase signal Sp that appears in the node p3 is input to the second input terminal 22 of the impulse generation circuit 20A as the second signal S2. Further, a node p4 which is a positive phase-side output node of the differential variable delay element 12D (a positive phase-side input node of the differential variable delay elements 12E) is connected to the second input terminal 22 of the impulse generation circuit 20B, and the positive-phase signal Sp that appears in the node p4 is input to the second input terminal 22 of the impulse generation circuit 20B as the second signal S2. Further, a node p5 which is a positive phase-side output node of the differential variable delay element 12E (a positive phase-side input node of the differential variable delay element 12F) is connected to the second input terminal 22 of the impulse generation circuit 20C, and the positive-phase signal Sp that appears in the node p5 is input to the second input terminal 22 of the impulse generation circuit 20C as the second signal S2. Further, a node p6 which is a positive phase-side output node of the differential variable delay element 12F (a positive phase-side input node of the differential variable delay element 12G) is connected to the second input terminal 22 of the impulse generation circuit 20D, and the positive-phase signal Sp that appears in the node p6 is input to the second input terminal 22 of the impulse generation circuit 20D as the second signal S2.

As described above, in the pulse-position modulation circuit 1 according to the present embodiment, the negative-phase signal Sn delayed by the delay amount different from that of the positive-phase signal Sp to be input as the first signal S1 is input to each of the impulse generation circuits 20A to 20D as the second signal S2.

Figure 2:
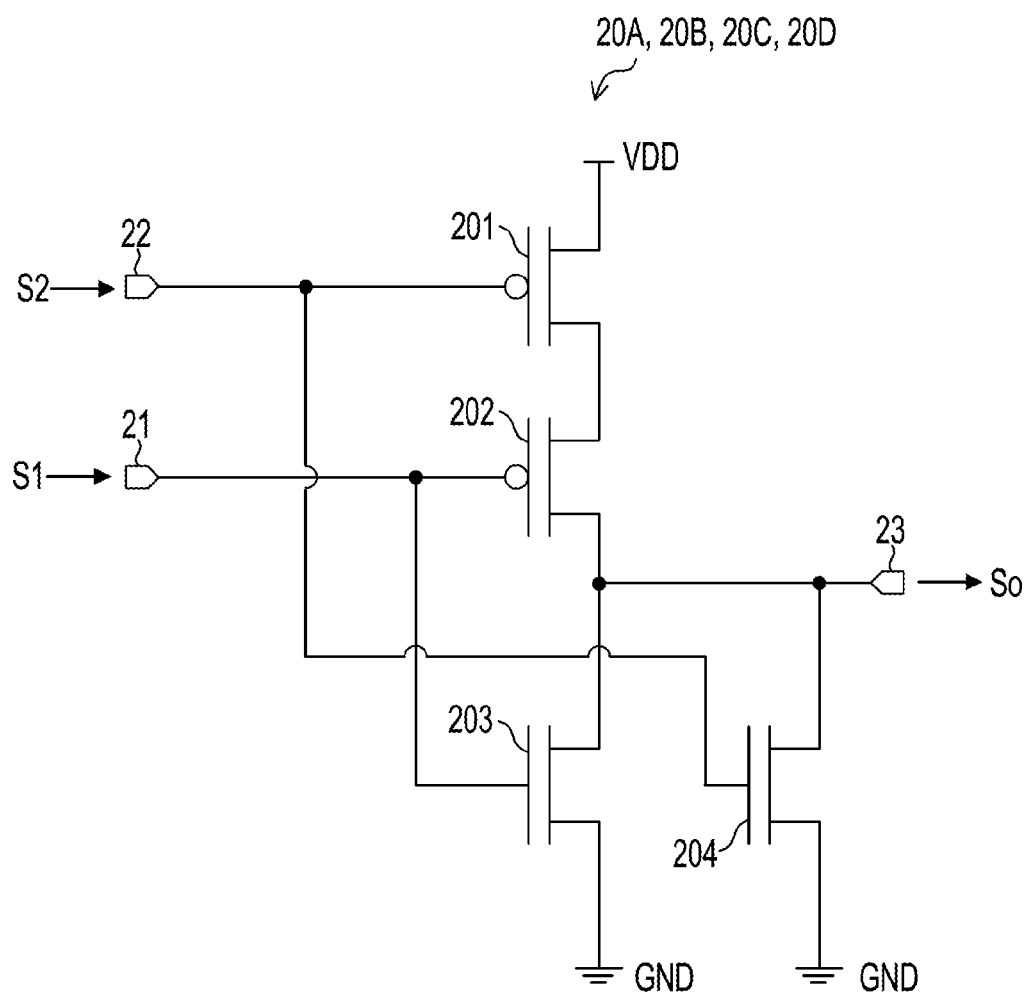
FIG. 2 is a circuit diagram illustrating an example of a configuration of an impulse generation circuit according to an embodiment of the present disclosure.

FIG. 2 is a circuit diagram illustrating an example of a configuration of each of the impulse generation circuits 20A to 20D. Each of the impulse generation circuits 20A to 20D is configured to include p channel type metal-oxide-semiconductor field-effect transistors (MOSFETs) 201 and 202 (hereinafter, referred to as P-MOS 201 and P-MOS 202) and n channel type MOSFETs 203 and 204 (hereinafter, referred to as N-MOS 203 and N-MOS 204).

In the P-MOS 201, the gate is connected to the second input terminal 22, the source is connected to a power supply line VDD, and the drain is connected to the source of the P-MOS 202. In the P-MOS 202, the gate is connected to the first input terminal 21, and the drain is connected to the output terminal 23. In the N-MOS 203, the gate is connected to the first input terminal 21, the drain is connected to the output terminal 23, and the source is connected to a ground line GND. In the N-MOS 204, the gate is connected to the second input terminal 22, the drain is connected to the output terminal 23, and the source is connected to a ground line GND.

Figure 3:
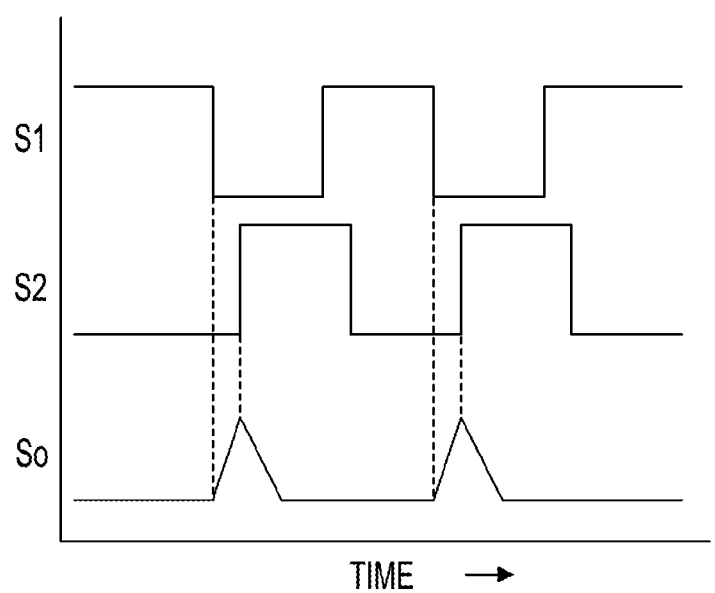
FIG. 3 is a timing chart illustrating an example of an operation of an impulse generation circuit according to an embodiment of the present disclosure.

FIG. 3 is a timing chart illustrating an example of an operation of each of the impulse generation circuits 20A to 20D. It is assumed that in the initial state, the second signal S2 input to the second input terminal 22 is at a low level and the first signal S1 input to the first input terminal 21 is at a high level. That is, in the initial state, each of the P-MOS 201 and the N-MOS 203 is in an ON state, and each of the P-MOS 202 and the N-MOS 204 is in an OFF state. Thereafter, when the first signal S1 transits from the high level to the low level, the P-MOS 202 becomes the ON state, and the N-MOS 203 becomes the OFF state. As a result, the level of an output signal So which is output from the output terminal 23 rises. Thereafter, when the second signal S2 transits from the low level to the high level, the P-MOS 201 becomes the OFF state, and the N-MOS 204 becomes the ON state. As a result, the level of the output signal So which is output from the output terminal 23 falls.

As described above, in the impulse generation circuits 20A to 20D according to the embodiment, a pulse is generated at a timing when both the first and second signals S1 and S2 are at the low level, and the pulse width of the pulse becomes a width corresponding to the phase difference between the first and second signals S1 and S2 (more specifically, a time width between the falling edge of the first signal S1 and the rising edge of the second signal S2). When the phase difference between the first and second signals S1 and S2 is made extremely small, the pulse output from the output terminal 23 output as the output signal So has an impulse shape.

The selection circuit 30 includes switches 31A, 31B, 31C, and 31D that correspond to the impulse generation circuits 20A, 20B, 20C, and 20D, respectively. In the switch 31A, one end is connected to the output terminal 23 of the impulse generation circuit 20A, and the other end is connected to an output line 32. In the switch 31B, one end is connected to the output terminal 23 of the impulse generation circuit 20B, and the other end is connected to the output line 32. In the switch 31C, one end is connected to the output terminal 23 of the impulse generation circuit 20C, and the other end is connected to the output line 32. In the switch 31D, one end is connected to the output terminal 23 of the impulse generation circuit 20D, and the other end is connected to the output line 32. The selection circuit 30 selectively turns on any one of the switches 31A to 31D based on an input signal Sin supplied from the outside. The impulse generated by the pulse generation circuit connected to the turned-on switch is output to the output line 32 as a modulated signal Sm. As described above, the selection circuit 30 selectively outputs one of the impulses generated by the respective impulse generation circuits 20A to 20D at different timings, based on the input signal Sin.

Figure 4:
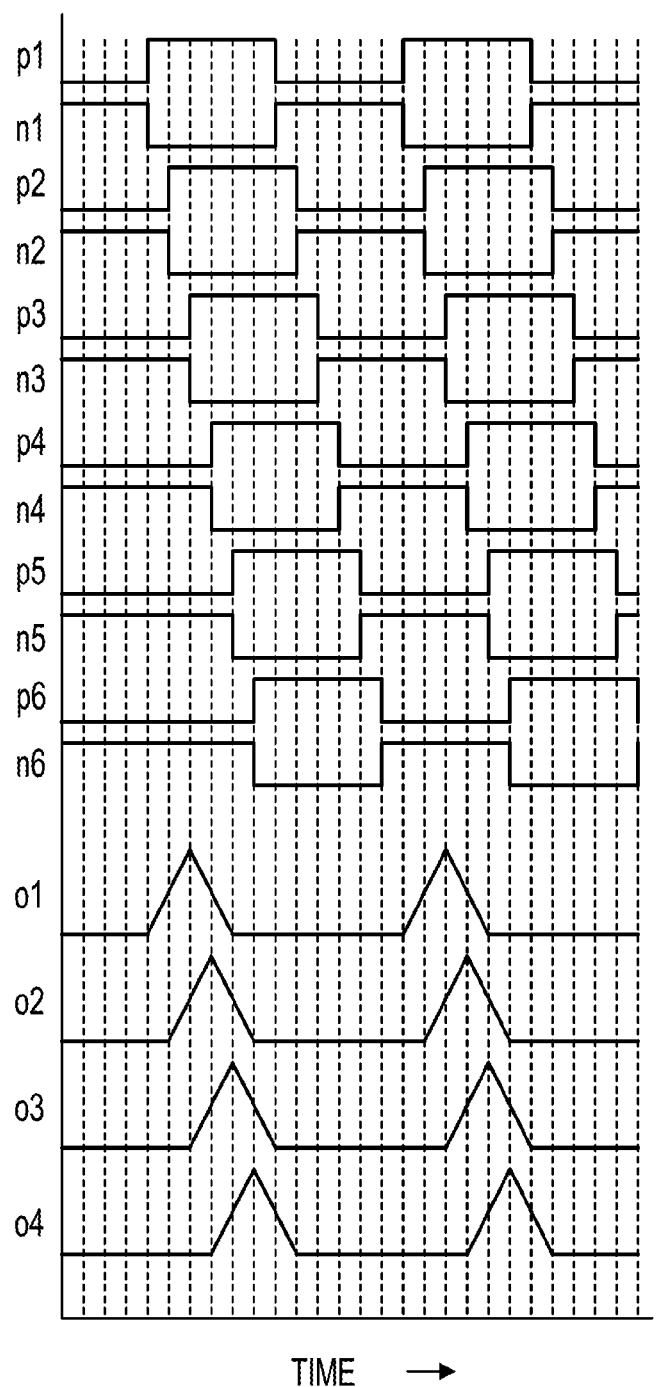
FIG. 4 is a timing chart illustrating an example of an operation of a pulse-position modulation circuit according to an embodiment of the present disclosure.

Hereinafter, an operation of the pulse-position modulation circuit 1 will be described. FIG. 4 is a timing chart illustrating an example of an operation of the pulse-position modulation circuit 1. FIG. 4 represents a waveform of each unit of the pulse-position modulation circuit 1 in a state where the delay locked loop is locked (i.e., a state where the delay amount of each of the differential variable delay elements 12A to 12G is settled).

The positive-phase signals Sp delayed by different delay amounts appear in the respective nodes p1 to p6 on the positive phase side of the signal lines to which the differential variable delay elements 12A to 12G are connected in a cascade. That is, the phases of the positive-phase signals Sp that appear in the nodes p1 to p6 are different from each other. Similarly, the negative-phase signals Sn delayed by different delay amounts appear in the nodes n1 to n6 on the negative phase side of the signal lines. That is, the phases of the negative-phase signals Sn that appear in the nodes n1 to n6 are different from each other.

In the impulse generation circuit 20A, the negative-phase signal Sn that appears in the node n1 is input to the first input terminal 21 as the first signal S1, and the positive-phase signal Sp that appears in the node p3 is input to the second input terminal 22 as the second signal S2. The impulse generation circuit 20A generates an impulse at a timing when both the negative-phase signal Sn that appears in the node n1 and the positive-phase signal Sp that appears in the node p3 are at the low level, and outputs the impulse to a node o1 connected to the output terminal 23. The pulse width of the impulse output from the impulse generation circuit 20A becomes a width corresponding to the phase difference between the negative-phase signal Sn that appears in the node n1 and the positive-phase signal Sp that appears in the node p3.

In the impulse generation circuit 20B, the negative-phase signal Sn that appears in the node n2 is input to the first input terminal 21 as the first signal S1, and the positive-phase signal Sp that appears in the node p4 is input to the second input terminal 22 as the second signal S2. The impulse generation circuit 20B generates an impulse at a timing when both the negative-phase signal Sn that appears in the node n2 and the positive-phase signal Sp that appears in the node p4 are at the low level, and outputs the impulse to a node o2 connected to the output terminal 23. The pulse width of the impulse output from the impulse generation circuit 20B becomes a width corresponding to the phase difference between the negative-phase signal Sn that appears in the node n2 and the positive-phase signal Sp that appears in the node p4.

In the impulse generation circuit 20C, the negative-phase signal Sn that appears in the node n3 is input to the first input terminal 21 as the first signal S1, and the positive-phase signal Sp that appears in the node p5 is input to the second input terminal 22 as the second signal S2. The impulse generation circuit 20C generates an impulse at a timing when both the negative-phase signal Sn that appears in the node n3 and the positive-phase signal Sp that appears in the node p5 are at the low level, and outputs the impulse to a node o3 connected to the output terminal 23. The pulse width of the impulse output from the impulse generation circuit 20C becomes a width corresponding to the phase difference between the negative-phase signal Sn that appears in the node n3 and the positive-phase signal Sp that appears in the node p5.

In the impulse generation circuit 20D, the negative-phase signal Sn that appears in the node n4 is input to the first input terminal 21 as the first signal S1, and the positive-phase signal Sp that appears in the node p6 is input to the second input terminal 22 as the second signal S2. The impulse generation circuit 20D generates an impulse at a timing when both the negative-phase signal Sn that appears in the node n4 and the positive-phase signal Sp that appears in the node p6 are at the low level, and outputs the impulse to a node o4 connected to the output terminal 23. The pulse width of the impulse output from the impulse generation circuit 20D becomes a width corresponding to the phase difference between the negative-phase signal Sn that appears in the node n4 and the positive-phase signal Sp that appears in the node p6.

As described above, the negative-phase signals Sn that appear in the different nodes on the negative-phase side of the signal lines are input to the impulse generation circuits 20A to 20D as the first signals 51, and the positive-phase signals Sp that appear in the different nodes on the positive phase side of the signal lines are input to the impulse generation circuits 20A to 20D as the second signals S2. Therefore, the impulse generation circuits 20A to 20D generate the impulses at different timings. The pulse width of the impulse generated by each of the impulse generation circuits 20A to 20D becomes the width corresponding to the phase difference between the negative-phase signal Sn input as the first signal S1 and the positive-phase signal Sp input as the second signal S2.

The selection circuit 30 selects one of the impulses generated by the impulse generation circuits 20A to 20D at different timings, respectively, based on the input signal Sin, and outputs the selected impulse to the output line 32 as the modulated signal Sm. Therefore, a pulse position modulation of outputting the impulse at the time position corresponding to the input signal Sin is implemented.

Figure 5:
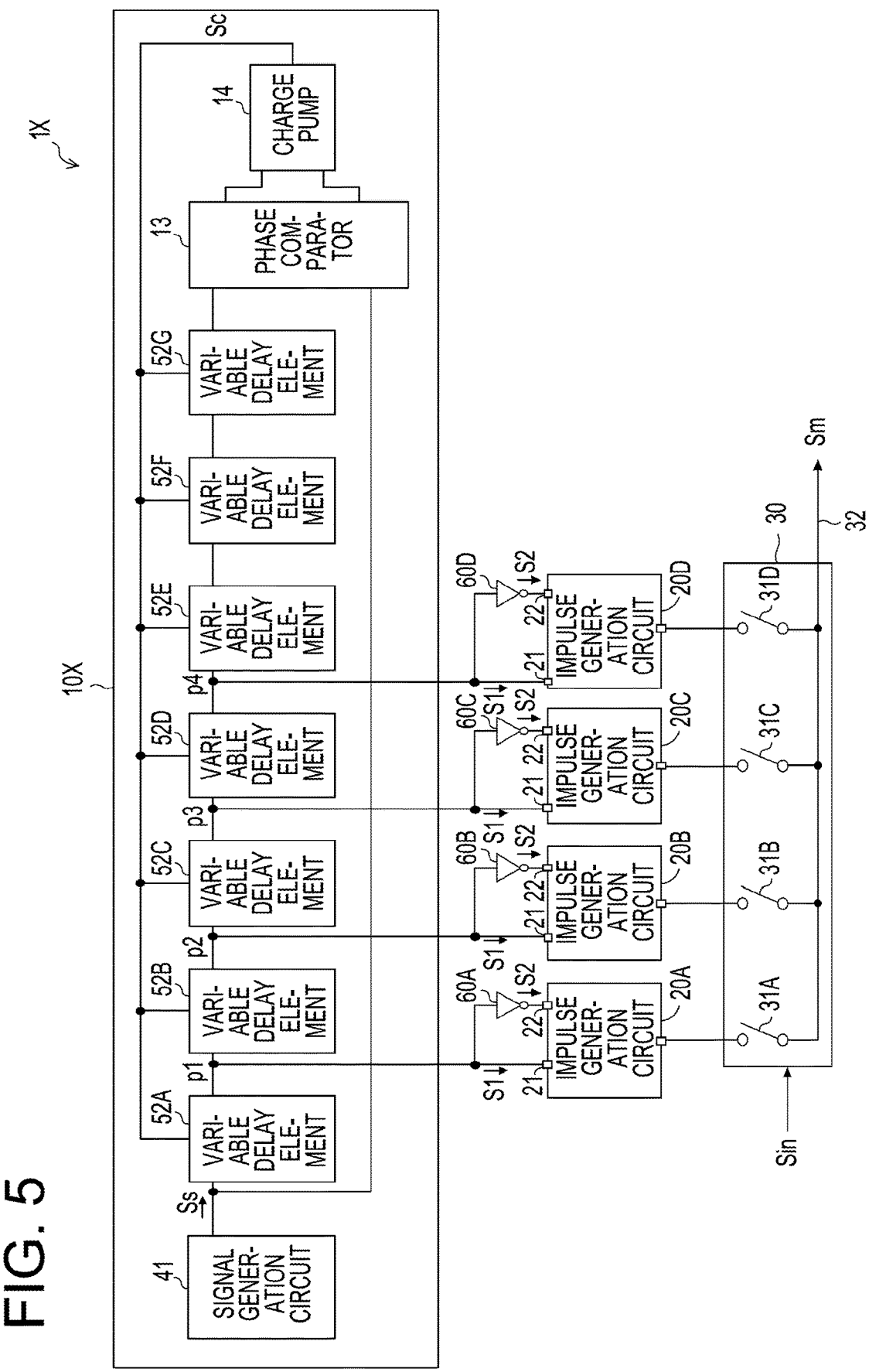
FIG. 5 is a circuit block diagram illustrating an example of a configuration of a pulse-position modulation circuit according to a comparative example.

Here, FIG. 5 is a circuit block diagram illustrating an example of a configuration of a pulse-position modulation circuit 1X according to a comparative example. In the pulse-position modulation circuit 1X according to the comparative example, a signal used in a delay locked loop circuit 10X is configured in a single-end scheme. That is, a signal generation circuit 41 generates a signal-end scheme signal Ss of a predetermined period. The signal Ss generated by the signal generation circuit 41 is input to a first-stage variable delay element 52A and the phase comparator 13. Each of the variable delay elements 52A to 52G delays the input signal Ss by a time width corresponding to the control signal Sc, and supplies the delayed signal to the rear-stage differential variable delay element. Since the plurality of variable delay elements 52A to 52G are connected in a cascade, the delay amounts of the signal Ss are accumulated.

The signal Ss that appears in a node p1 which is an output node of the variable delay element 52A (an input node of the variable delay element 52B) is input to the first input terminal 21 of the impulse generation circuit 20A as the first signal S1. Further, the signal Ss that appears in the node p1 is inverted by an inverter 60A that functions as an inversion delay element, and is delayed at the same time. Then, the inverted and delayed signal Ss is input to the second input terminal 22 of the impulse generation circuit 20A as the second signal S2.

The signal Ss that appears in a node p2 which is an output node of the variable delay element 52B (an input node of the variable delay element 52C) is input to the first input terminal 21 of the impulse generation circuit 20B as the first signal S1. Further, the signal Ss that appears in the node p2 is inverted by an inverter 60B that functions as an inversion delay element, and is delayed at the same time. Then, the inverted and delayed signal Ss is input to the second input terminal 22 of the impulse generation circuit 20B as the second signal S2.

The signal Ss that appears in a node p3 which is an output node of the variable delay element 52C (an input node of the variable delay element 52D) is input to the first input terminal 21 of the impulse generation circuit 20C as the first signal S1. Further, the signal Ss that appears in the node p3 is inverted by an inverter 60C that functions as an inversion delay element, and is delayed at the same time. Then, the inverted and delayed signal Ss is input to the second input terminal 22 of the impulse generation circuit 20C as the second signal S2.

The signal Ss that appears in a node p4 which is an output node of the variable delay element 52D (an input node of the variable delay element 52E) is input to the first input terminal 21 of the impulse generation circuit 20D as the first signal S1. Further, the signal Ss that appears in the node p4 is inverted by an inverter 60D that functions as an inversion delay element, and is delayed at the same time. Then, the inverted and delayed signal Ss is input to the second input terminal 22 of the impulse generation circuit 20D as the second signal S2.

In the pulse-position modulation circuit 1X according to the comparative example, the configuration of each of the impulse generation circuits 20A to 20D is similar to that in the pulse-position modulation circuit 1 according to the present disclosure. That is, in the pulse-position modulation circuit 1X according to the comparative example, each of the impulse generation circuits 20A to 20D generates an impulse with a pulse width corresponding to the phase difference between the first and second signals S1 and S2 at a timing corresponding to the states of the first and second signals S1 and S2.

According to the pulse-position modulation circuit 1X of the comparative example, the impulse generation circuits 20A to 20D generate impulses at the timings corresponding to the signal Ss that appears in the different nodes p1 to p4 of the signal line to which the variable delay elements 52A to 52G are connected in a cascade, respectively. Accordingly, it is possible to accurately control the time position of the impulse to be output as the modulated signal Sm. However, in the pulse-position modulation circuit 1X according to the comparative example, the pulse widths of the impulses output from the impulse generation circuits 20A to 20D depend on the delay amounts of the inverters 60A to 60D. The delay amounts of the inverters 60A to 60D change according to the performance variations and temperature changes of the inverters 60A to 60D. Accordingly, in the pulse-position modulation circuit 1X according to the comparative example, the pulse widths of the impulses output from the impulse generation circuits 20A to 20D may easily fluctuate.

Meanwhile, according to the pulse-position modulation circuit 1 of the present disclosure, the negative-phase signals Sn that appear in the signal lines to which the differential variable delay elements 12A to 12G are connected in a cascade are input to the impulse generation circuits 20A to 20D as the first signals S1, respectively. Further, the positive-phase signals Sp that appear in the signal lines are input to the impulse generation circuits 20A to 20D as the second signals S2, respectively. In this way, since the signals that appear in the respective nodes in the delay locked loop are used as the first and second signals S1 and S2 to be input to the impulse generation circuits 20A to 20D, a fluctuation in phase difference between the first and second signals S1 and S2 may be suppressed. Therefore, it is possible to suppress the fluctuation of the pulse widths of the impulses output from the impulse generation circuits 20A to 20D, and furthermore, it is possible to suppress the fluctuation of the pulse width in the modulated signal Sm. Further, according to the pulse-position modulation circuit 1, it is possible to accurately control the time position of the impulse to be output as the modulated signal Sm.

In the embodiment, a case where the pulse-position modulation circuit 1 includes the four impulse generation circuits 20A to 20D has been described. However the present disclosure is not limited to the embodiment. For example, the number of impulse generation circuits included in the pulse-position modulation circuit 1 may be appropriately increased or decreased according to the number of states expressed by one symbol of the modulated signal Sm. For example, when one symbol of the modulated signal Sm expresses 16 values, at least 16 impulse generation circuits are formed in the pulse-position modulation circuit 1.

In the embodiment, a case where the delay locked loop circuit 10 includes the seven differential variable delay elements has been described. However, the number of differential variable delay elements included in the delay locked loop circuit 10 may be appropriately increased and decreased according to the number of impulse generation circuits included in the pulse-position modulation circuit 1.

In the embodiment, a case where an impulse with an extremely small pulse width is generated by using the impulse generation circuits 20A to 20D has been described. However, the present disclosure is not limited to the embodiment. For example, the present disclosure may also be applied to a case where a pulse having a relatively large pulse width, for example, a rectangular shape is generated using the impulse generation circuits 20A to 20D.

Second Embodiment

Figure 6:
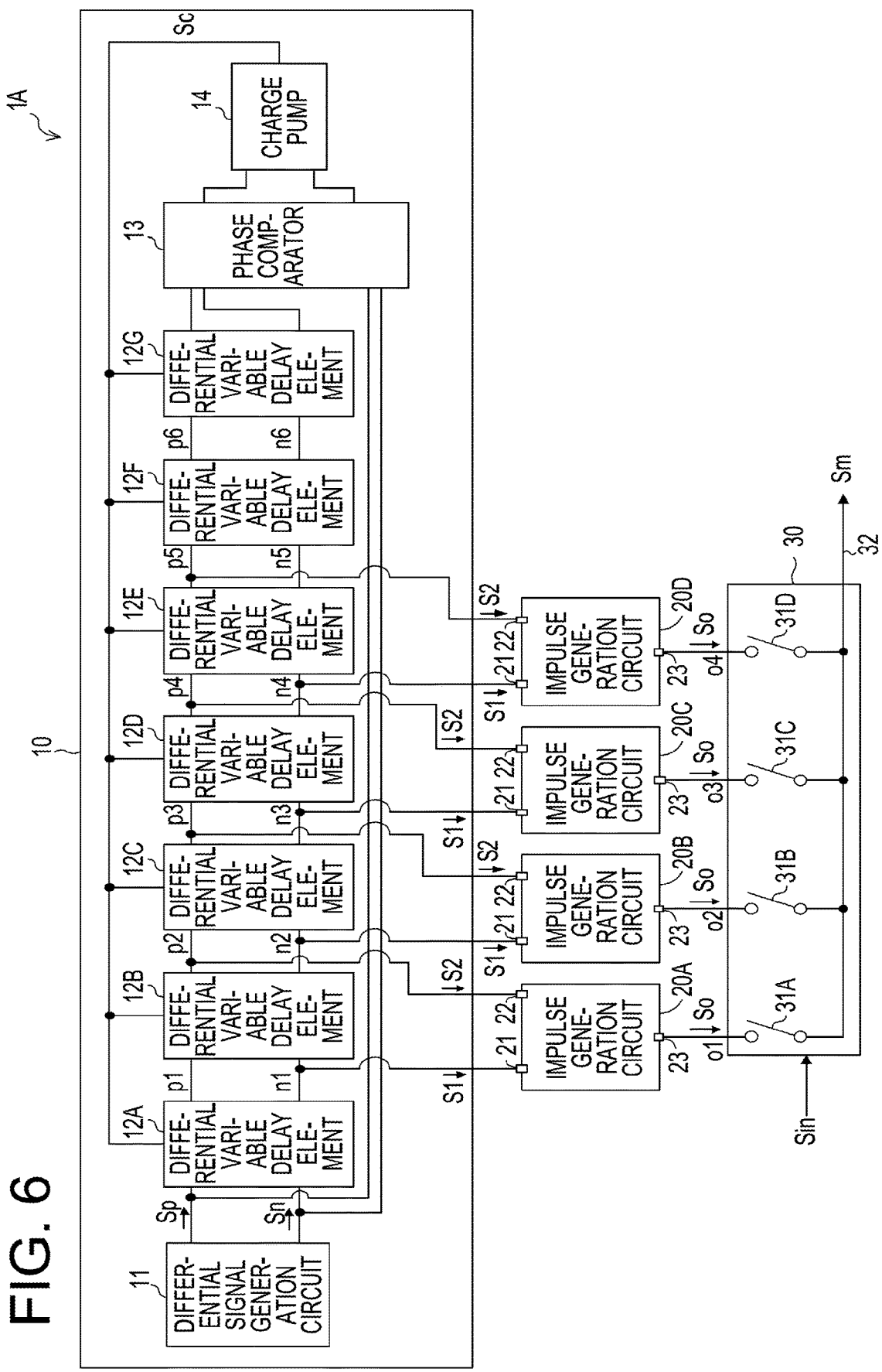
FIG. 6 is a circuit block diagram illustrating an example of a configuration of a pulse-position modulation circuit according to an embodiment of the present disclosure.

FIG. 6 is a circuit block diagram illustrating an example of a configuration of a pulse-position modulation circuit 1A according to a second embodiment of the present disclosure.

In the pulse-position modulation circuit 1 according to the first embodiment (see FIG. 1), the positive-phase signal Sp that appears in the node p3 is input to the second input terminal 22 of the impulse generation circuit 20A as the second signal S2. In this regard, in the pulse-position modulation circuit 1A according to the second embodiment, the positive-phase signal Sp that appears in the node p2 is input to the second input terminal 22 of the impulse generation circuit 20A as the second signal S2.

Further, in the pulse-position modulation circuit 1 according to the first embodiment, the positive-phase signal Sp that appears in the node p4 is input to the second input terminal 22 of the impulse generation circuit 20B as the second signal S2. In this regard, in the pulse-position modulation circuit 1A according to the second embodiment, the positive-phase signal Sp that appears in the node p3 is input to the second input terminal 22 of the impulse generation circuit 20B as the second signal S2.

Further, in the pulse-position modulation circuit 1 according to the first embodiment, the positive-phase signal Sp that appears in the node p5 is input to the second input terminal 22 of the impulse generation circuit 20C as the second signal S2. In this regard, in the pulse-position modulation circuit 1A according to the second embodiment, the positive-phase signal Sp that appears in the node p4 is input to the second input terminal 22 of the impulse generation circuit 20C as the second signal S2.

Further, in the pulse-position modulation circuit 1 according to the first embodiment, the positive-phase signal Sp that appears in the node p6 is input to the second input terminal 22 of the impulse generation circuit 20D as the second signal S2. In this regard, in the pulse-position modulation circuit 1A according to the second embodiment, the positive-phase signal Sp that appears in the node p5 is input to the second input terminal 22 of the impulse generation circuit 20D as the second signal S2.

As described above, in the impulse generation circuits 20A to 20D, the signals to be recovered as the second signals S2 are appropriately selected, so that the pulse widths of the impulses output as the output signals So from the impulse generation circuits 20A to 20D may be adjusted.

Third Embodiment

Figure 7:
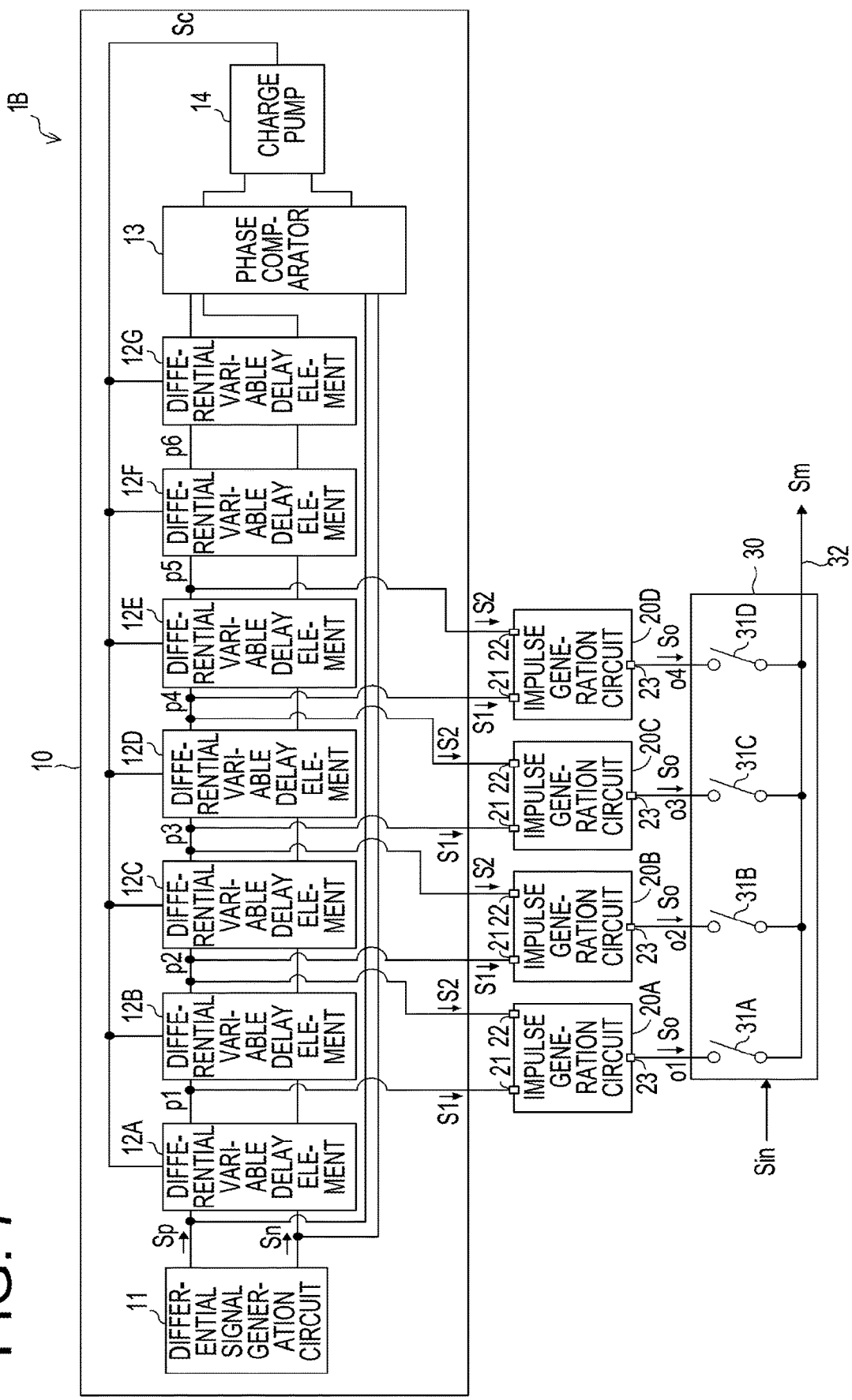
FIG. 7 is a circuit block diagram illustrating an example of a configuration of a pulse position modulation circuit according to an embodiment of the present disclosure.

FIG. 7 is a circuit block diagram illustrating an example of a configuration of a pulse-position modulation circuit 1B according to a third embodiment of the present disclosure. In the pulse-position modulation circuit 1B, the nodes p1, p2, p3, and p4 on the positive phase side of the signal lines to which the differential variable delay elements 12A to 12G are connected in a cascade are connected to the first input terminals 21 of the impulse generation circuits 20A to 20D, respectively. That is, the positive-phase signals Sp that appear in the nodes p1 to p4 are used as the first signals S1 in the impulse generation circuits 20A to 20D, respectively. Further, the nodes p2, p3, p4, and p5 on the positive phase side of the signal lines are connected to the second input terminals 22 of the impulse generation circuits 20A to 20D, respectively. That is, the positive-phase signals Sp that appear in the nodes p2 to p5 are used as the second signals S2 in the impulse generation circuits 20A to 20D, respectively.

Figure 8:
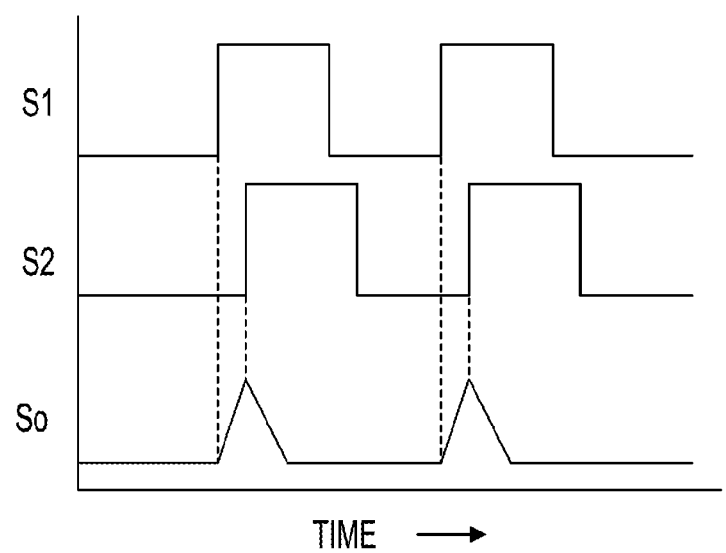
FIG. 8 is a timing chart illustrating an example of an operation of an impulse generation circuit included in a pulse-position modulation circuit.

FIG. 8 is a timing chart illustrating an example of an operation of each of impulse generation circuits 20A to 20D included in the pulse-position modulation circuit 1B. As illustrated in FIG. 8, each of the impulse generation circuits 20A to 20D according to the embodiment generates an impulse at the timing when the first signal S1 input to the first input terminal 21 is at the high level and the second signal S2 input to the second input terminal 22 is at the low level. The pulse width of the impulse becomes the width corresponding to the phase difference between the first and second signals S1 and S2.

According to the pulse-position modulation circuit 1B of the third embodiment, it is possible to suppress the fluctuation of the pulse widths of the impulses output from the impulse generation circuits 20A to 20D, and furthermore, it is possible to suppress the fluctuation of the pulse width in the modulated signal Sm. Further, according to the pulse-position modulation circuit 1B, it is possible to accurately control the time position of the impulse to be output as the modulated signal Sm.

Further, in the embodiment, a case where the positive-phase signals Sp are used as the first and second signals S1 and S2 input to the impulse generation circuits 20A to 20D has been described. However, the negative-phase signals Sn may be used as the first and second signals S1 and S2 as well. Further, when only the positive-phase signals Sp or only the negative-phase signals Sn are used as the first and second signals S1 and S2 input to the impulse generation circuits 20A to 20D, the signals used in the delay locked loop circuit 10 may be configured in the single-end scheme instead of a differential scheme.

Fourth Embodiment

Figure 9:
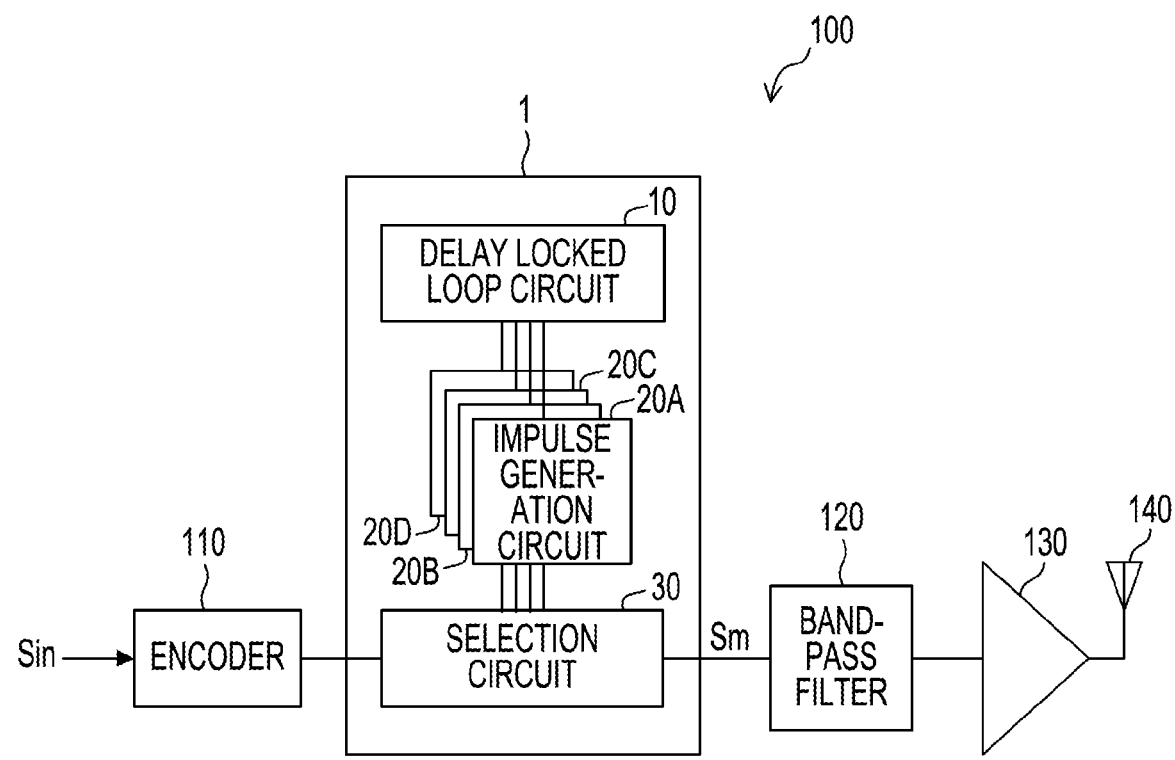
FIG. 9 is a circuit block diagram illustrating an example of a configuration of a transmission circuit according to an embodiment of the present disclosure.

FIG. 9 is a circuit block diagram illustrating an example of a configuration of a transmission circuit 100 according to a fourth embodiment of the present disclosure. The transmission circuit 100 is configured to include the pulse-position modulation circuit 1 according to the first embodiment of the present disclosure, an encoder 110, a band-pass filter 120, a power-up 130, and an antenna 140.

The encoder 110 encodes an input signal Sin including data transmitted from the transmission circuit 100. The encoded input signal Sin is supplied to the selection circuit 30 that constitutes the pulse-position modulation circuit 1. The pulse-position modulation circuit 1 performs a pulse position modulation of outputting the impulse at the time position corresponding to the encoded input signal Sin. The band-pass filter 120 removes unnecessary frequency components of the modulated signal Sm output from the pulse-position modulation circuit 1. The power-up 130 amplifies and outputs the modulated signal Sm from which the unnecessary frequency components are removed by the band-pass filter 120. The modulated signal Sm amplified by the power-up 130 is transmitted from the antenna 140 as the transmission signal.

According to the transmission circuit 100 of the embodiment, since the variation of the pulse width in the modulated signal Sm output from the pulse-position modulation circuit 1 is suppressed, the frequency spectrum of the transmission signal transmitted from the transmission circuit 100 is easily controlled.

Instead of the pulse-position modulation circuit 1 according to the first embodiment of the present disclosure, the transmission circuit 100 may be configured to include the pulse-position modulation circuit 1A according to the second embodiment (see FIG. 6) or the pulse-position modulation circuit 1B according to the third embodiment (see FIG. 7).

In addition, the pulse-position modulation circuit 1, 1A, or 1B is an example of the pulse-position modulation circuit in the present disclosure. The delay locked loop circuit 10 is an example of the delay locked loop circuit in the present disclosure. The differential variable delay element 12A, 12B, 12C, 12D, 12E, 12F, or 12G is an example of the delay element in the present disclosure. The impulse generation circuits 20A, 20B, 20C, or 20D is an example of the pulse generation circuit in the present disclosure. The selection circuit 30 is an example of the selection circuit in the present disclosure. The transmission circuit 100 is an example of the transmission circuit in the present disclosure. The power-up 130 is an example of an amplification circuit in the present disclosure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A pulse position modulation circuit comprising:
    a delay locked loop circuit configured to include a plurality of delay circuits coupled in a cascade, each of the plurality of delay circuits being configured to delay an input signal by a time width corresponding to a control signal so as to generate an output signal;
    a plurality of pulse generation circuits, each of which is configured to generate a pulse with a pulse width corresponding to a phase difference between a first signal and a second signal which have different phases from each other at different timings corresponding to states of the first signal and the second signal, each of the first signal and the second signal being the input signal or the output signal of the plurality of delay circuits; and
    a selection circuit configured to select pulses generated by the plurality of pulse generation circuits.

2. The pulse position modulation circuit according to claim 1,
    wherein each of the plurality of delay circuits delays a differential signal constituted by a positive-phase signal and a negative-phase signal of which phases are inverted from each other, by the time width corresponding to the control signal, and supplies the delayed differential signal to a rear-stage delay circuit of the plurality of delay circuits, and
    wherein the negative-phase signal is input to the plurality of pulse generation circuits as the first signal, and the positive-phase signal is input to the plurality of pulse generation circuits as the second signal.

3. The pulse position modulation circuit according to claim 2,
    wherein the negative-phase signal delayed by a different delay amount from a delay amount of the positive-phase signal to be input as the first signal is input to the plurality of pulse generation circuits as the second signal.

4. The pulse position modulation circuit according to claim 1,
    wherein each of the plurality of pulse generation circuits generates an impulse as the pulse.

5. The pulse position modulation circuit according to claim 1,
    wherein a number of plurality of delay circuits is larger than a number of plurality of pulse generation circuits.

6. The pulse position modulation circuit according to claim 1,
    wherein the delay locked loop circuit generates the control signal corresponding to a phase difference between a signal input to a first-stage delay circuit of the plurality of delay circuits and a signal output from a final-stage delay circuit of the plurality of delay circuits.

7. A transmission circuit comprising:

a delay locked loop circuit configured to include a plurality of delay circuits coupled in a cascade, each of the plurality of delay circuits being configured to delay an input signal by a time width corresponding to a control signal so as to generate an output signal;

a plurality of pulse generation circuits, each of which is configured to generate a pulse with a pulse width corresponding to a phase difference between a first signal and a second signal which have different phases from each other at different timings corresponding to states of the first signal and the second signal, each of the first signal and the second signal being the input signal or the output signal of the plurality of delay circuits;

a selection circuit configured to select pulses generated by the plurality of pulse generation circuits; and an amplification circuit configured to amplify the pulses selected by the selection circuit.

8. The transmission circuit according to claim 7, wherein each of the plurality of delay circuits delays a differential signal constituted by a positive-phase signal and a negative-phase signal of which phases are inverted from each other, by the time width corresponding to the control signal, and supplies the delayed differential signal to a rear-stage delay circuit of the plurality of delay circuits, and wherein the negative-phase signal is input to the plurality of pulse generation circuits as the first signal, and the positive-phase signal is input to the plurality of pulse generation circuits as the second signal.

9. The transmission circuit according to claim 8, wherein the negative-phase signal delayed by a different delay amount from a delay amount of the positive-phase signal to be input as the first signal is input to the plurality of pulse generation circuits as the second signal.

10. The transmission circuit according to claim 7, wherein each of the plurality of pulse generation circuits generates an impulse as the pulse.

11. The transmission circuit according to claim 7, wherein a number of plurality of delay circuits is larger than a number of plurality of pulse generation circuits.

12. The transmission circuit according to claim 7, wherein the delay locked loop circuit generates the control signal corresponding to a phase difference between a signal input to a first-stage delay circuit of the plurality of delay circuits and a signal output from a final-stage delay circuit of the plurality of delay circuits.

* * * * *